(12) United States Patent
Kim et al.

(10) Patent No.: US 12,153,808 B2
(45) Date of Patent: Nov. 26, 2024

(54) MEMORY DEVICE AND DATA INITIALIZATION METHOD OF THE SAME

(71) Applicant: SAMSUNG ELECTRONICS CO., LTD., Suwon-si (KR)

(72) Inventors: Jiwoong Kim, Yongin-si (KR); Moonki Jang, Hwaseong-si (KR); Yunhwan Kim, Suwon-si (KR); Myeongwhan Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 18/148,289

(22) Filed: Dec. 29, 2022

(65) Prior Publication Data
US 2023/0266892 A1    Aug. 24, 2023

(30) Foreign Application Priority Data
Feb. 23, 2022    (KR) .................. 10-2022-0023833

(51) Int. Cl.
*G06F 3/06*    (2006.01)
(52) U.S. Cl.
CPC .......... *G06F 3/0625* (2013.01); *G06F 3/0659* (2013.01); *G06F 3/0673* (2013.01)
(58) Field of Classification Search
CPC ..... G06F 3/0625; G06F 3/0673; G06F 3/0659
See application file for complete search history.

(56) References Cited

U.S. PATENT DOCUMENTS

| | | | |
|---|---|---|---|
| 7,248,519 B2* | 7/2007 | Kim | .............. G11C 11/413 |
| | | | 365/226 |
| 7,391,670 B2 | 6/2008 | Lee | |
| 8,588,024 B2 | 11/2013 | Patel et al. | |
| 9,286,971 B1 | 3/2016 | Hess et al. | |

FOREIGN PATENT DOCUMENTS

| | | |
|---|---|---|
| JP | H0863968 | 3/1966 |
| JP | 2006202397 | 8/2006 |
| JP | 2013080545 | 5/2013 |

* cited by examiner

*Primary Examiner* — Mark A Giardino, Jr.
(74) *Attorney, Agent, or Firm* — F. Chau & Associates, LLC

(57) ABSTRACT

A memory device includes a row decoder that receives one or more normal addresses and one or more control addresses, and a memory cell array connected to the row decoder via a plurality of word lines. In a normal operation, in response to receiving the one or more normal addresses, any one word line among the plurality of word lines is enabled. In an initialization operation, in response to receiving the one or more normal addresses and the one or more control addresses, at least two word lines among the plurality of word lines are enabled. Data of memory cells of the memory cell array connected to the enabled at least two word lines is initialized.

20 Claims, 17 Drawing Sheets

FIG. 4

| CA1 | NA2 | NA1 | WL0 | WL1 | WL2 | WL3 |
|---|---|---|---|---|---|---|
| 0 | 0 | 0 | 1 | 0 | 0 | 0 |
| 0 | 1 | 0 | 0 | 1 | 0 | 0 |
| 0 | 0 | 1 | 0 | 0 | 1 | 0 |
| 0 | 1 | 1 | 0 | 0 | 0 | 1 |
| 1 | x | x | 1 | 1 | 1 | 1 |

CASE 1 → (row 1)
CASE 2 → (row 5)

X: don't care

FIG. 8

| CA2 | CA1 | NA2 | NA1 | WL0 | WL1 | WL2 | WL3 |
|-----|-----|-----|-----|-----|-----|-----|-----|
| x   | 0   | 0   | 0   | 1   | 0   | 0   | 0   |
| x   | 0   | 1   | 0   | 0   | 1   | 0   | 0   |
| x   | 0   | 0   | 1   | 0   | 0   | 1   | 0   |
| x   | 0   | 1   | 1   | 0   | 0   | 0   | 1   |
| 0   | 1   | 0   | x   | 1   | 1   | 0   | 0   |
| 1   | 1   | 1   | x   | 0   | 0   | 1   | 1   |

↑ CASE 1

↑ CASE 2
↑ CASE 3

X: don't care

FIG. 14

| D[L] | D[M] | CA | NA2 | NA1 | WL0 | WL1 | WL2 | WL3 |
|------|------|----|----|----|----|----|----|----|
| x | x | 0 | 0 | 0 | 1 | 0 | 0 | 0 |
| x | x | 0 | 1 | 0 | 0 | 1 | 0 | 0 |
| x | x | 0 | 0 | 1 | 0 | 0 | 1 | 0 |
| x | x | 1 | 1 | 1 | 0 | 0 | 0 | 1 |
| 0 or 1 | 0 | 1 | 0 | x | 1 | 1 | 0 | 0 |
| 0 or 1 | 1 | 1 | 1 | x | 0 | 0 | 1 | 1 |

CASE 1 ↑ (row 1)
CASE 2 ↑ (row 5)
CASE 3 ↑ (row 6)

X: don't care

MEMORY DEVICE AND DATA INITIALIZATION METHOD OF THE SAME

CROSS-REFERENCE TO RELATED APPLICATION

This application is based on and claims priority under 35 U.S.C. § 119 to Korean Patent Application No. 10-2022-0023833, filed on Feb. 23, 2022 in the Korean Intellectual Property Office, the disclosure of which is incorporated by reference herein in its entirety.

TECHNICAL FIELD

Embodiments of the inventive concept relate to a memory device, and a data initialization method of the memory device.

DISCUSSION OF RELATED ART

Static random-access memory (SRAM) is widely used in a cache memory or the like due to its high operating speed, and is a type of digital circuit widely used for implementing functions of various processors. SRAM is mainly used in portable devices due to its low power consumption and high-speed operating characteristics, compared to other memories.

SUMMARY

Embodiments of the inventive concept provide a memory device that reduces time and power consumed during initializing static random-access memories (SRAMs) in word line units, and a data initialization method of the memory device.

According to an embodiment of the inventive concept, a memory device includes a row decoder that receives one or more normal addresses and one or more control addresses, and a memory cell array connected to the row decoder via a plurality of word lines. The memory cell array includes a plurality of memory cells. In a normal operation, in response to receiving the one or more normal addresses, any one word line among the plurality of word lines is enabled. In an initialization operation, in response to receiving the one or more normal addresses and the one or more control addresses, at least two word lines among the plurality of word lines are enabled. Data of memory cells from among the plurality of memory cells connected to the enabled at least two word lines is initialized.

According to an embodiment of the inventive concept, a data initialization method of a memory device includes receiving one or more normal addresses and one or more control addresses, and selecting and enabling one or more word lines among a plurality of word lines in response to receiving the one or more normal addresses and the one or more control addresses. The selecting and enabling of the one or more word lines causes the memory device to operate in a normal operation or an initialization operation. In the normal operation, in response to receiving the one or more normal addresses, any one word line among the plurality of word lines is enabled. In the initialization operation, in response to receiving the one or more normal addresses and the one or more control addresses, at least two word lines among the plurality of word lines are enabled. Data of memory cells connected to the enabled at least two word lines is initialized.

According to an embodiment of the inventive concept, a memory device includes a row decoder that receives one or more normal addresses and one or more control addresses, a column decoder that receives data of two bits or more, and a memory cell array including a plurality of memory cells, connected to the row decoder via a plurality of word lines, and connected to the column decoder via a plurality of bit lines. The memory device further includes a data connection control circuit connected to the memory cell array via the plurality of bit lines and configured to control a value of data provided to the plurality of bit lines, and a control logic configured to generate an enable signal activated in an initialization operation, and transmit the generated enable signal to the data connection control circuit. In a normal operation, in response to receiving the one or more normal addresses, any one word line among the plurality of word lines is enabled. In the initialization operation, in response to receiving the one or more normal addresses, the one or more control addresses, and a data most significant bit (MSB), at least two word lines among the plurality of word lines are enabled, and data of memory cells of the memory cell array connected to the enabled at least two word lines are initialized.

BRIEF DESCRIPTION OF THE DRAWINGS

Embodiments of the inventive concept will be more clearly understood from the following detailed description taken in conjunction with the accompanying drawings, in which:

FIG. 4 is a diagram illustrating a table for describing an operation of FIG. 3 according to an embodiment;

FIG. 8 is a diagram illustrating a table for describing an operation of FIG. 7 according to an embodiment;

FIG. 14 is a diagram illustrating a table for describing an operation of FIG. 13 according to an embodiment;

DETAILED DESCRIPTION OF THE EMBODIMENTS

Figure 1:
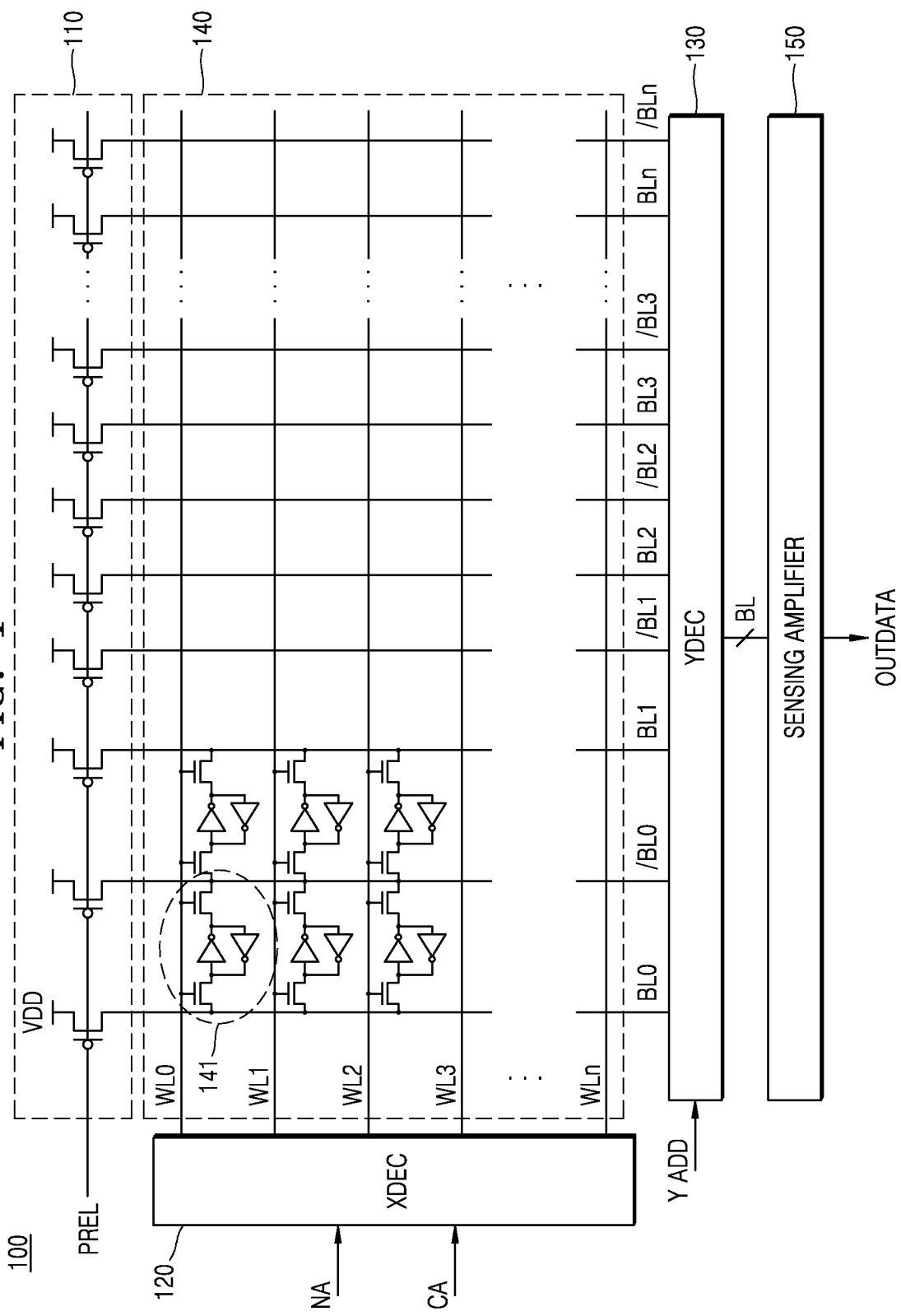
FIG. 1 is a block diagram of a memory device according to an embodiment.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component is referred to as being "on", "connected to", "coupled to", or "adjacent to" another component, it can be directly on, connected, coupled, or adjacent to the other component, or intervening components may be present. Other words used to describe the relationships between components should be interpreted in a like fashion.

FIG. 1 is a block diagram of a memory device 100 according to an embodiment.

Referring to FIG. 1, the memory device 100 may include a precharge circuit 110, a row decoder (XDEC) 120, a column decoder (YDEC) 130, a memory cell array 140, and a sense amplifier 150. The memory cell array 140 may include a plurality of memory cells 141. In an embodiment, the memory device 100 may include a static random access memory (SRAM) device, and each of the plurality of memory cells 141 may include an SRAM cell.

The precharge circuit 110 may receive a precharge control signal PREL. The precharge circuit 110 may precharge first through $n^{th}$ bit lines BL0 through BLn and/BL0 through/BLn to a power voltage VDD level, in response to the precharge control signal PREL, where n is a positive integer. The first through $n^{th}$ bit lines/BL0 through/BLn may also be referred to as first through $n^{th}$ complementary bit lines.

The XDEC 120 may receive a normal address NA and a control address CA. The XDEC 120 may select one of first through $n^{th}$ word lines WL0 through WLn in response to the normal address NA and the control address CA. In response to the normal address NA and the control address CA, one or more word lines among the first through $n^{th}$ word lines WL0 through WLn may be enabled. For example, in a data initialization operation, the XDEC 120 may apply an initialization voltage and an initialization verification voltage.

The YDEC 130 may decode a column address YADD, and select a bit line corresponding to the column address YADD among the first through $n^{th}$ bit lines BL0 through BLn and/BL0 through/BLn.

The sense amplifier 150 may generate various types of voltages for performing initialization, program, read, and erase operations based on a voltage control signal. The sense amplifier 150 may amplify the difference between signals output by the YDEC 130, and generate an output signal OUTDATA.

Figure 2:
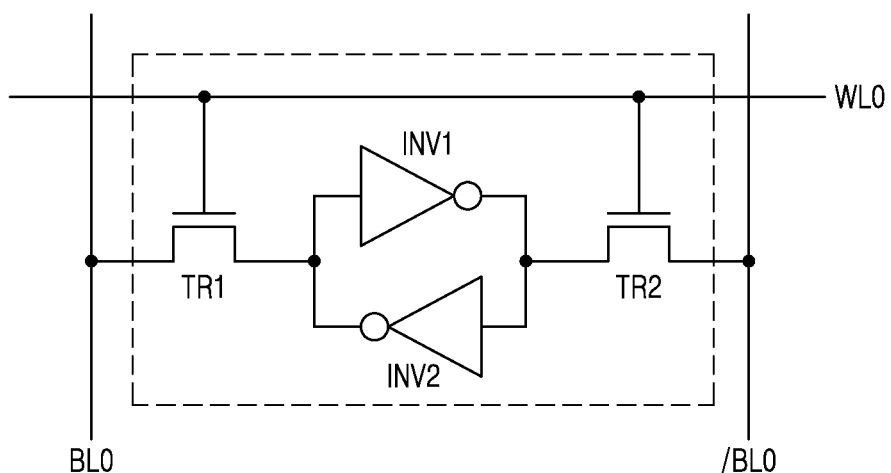
FIG. 2 is a structural diagram of a memory cell according to an embodiment.

FIG. 2 is a structural diagram of a memory cell 141 according to an embodiment. In FIG. 2, an SRAM cell provided in the memory cell array 140 is illustrated.

Referring to FIG. 2, the memory cell 141 may include a first transistor TR1, a second transistor TR2, a first inverter INV1, and a second inverter INV2, and the memory cell 141 may be connected to a pair of first bit lines BL0 and/BL0. The first inverter INV1 and the second inverter INV2 may constitute a latch.

A gate terminal of the first transistor TR1 may be connected to the first word line WL0, one terminal (for example, a source terminal) thereof may be connected to the first bit line BL0, and the other terminal (for example, a drain terminal) thereof may be connected to an input terminal of the first inverter INV1 and an output terminal of the second inverter INV2.

A gate terminal of the second transistor TR2 may be connected to the first word line WL0, one terminal (for example, a source terminal) thereof may be connected to an output terminal of the first inverter INV1 and an input terminal of the second inverter INV2, and the other terminal (for example, the drain terminal) may be connected to the first complementary bit line/BL0.

The input terminal of the first inverter INV1 may be connected to the one terminal of the first transistor TR1, and the output terminal thereof may be connected to the other terminal of the second transistor TR2.

The input terminal of the second inverter INV2 may be connected to the one terminal of the second transistor TR2, and the output terminal thereof may be connected to the other terminal of the first transistor TR1.

The first and second transistors TR1 and TR2 may include, for example, n-type metal-oxide semiconductor (NMOS) transistors, but embodiments are not limited thereto.

Figure 3:
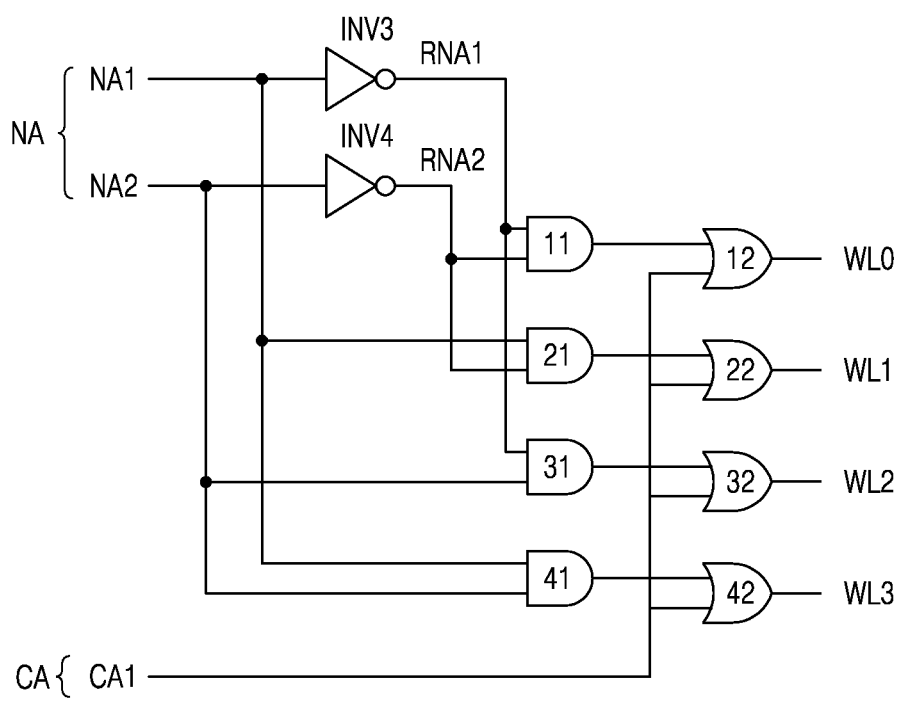
FIG. 3 is a logic diagram of a row decoder in a memory device, according to an embodiment.

FIG. 3 is a logic diagram of the XDEC 120 in a memory device, according to an embodiment.

Referring to FIGS. 1 through 3, the XDEC 120 may include a first inverter INV3, a second inverter INV4, first through fourth AND gates 11, 21, 31, and 41, and first through fourth OR gates 12, 22, 32, and 42.

The normal address NA may include a first normal address NA1 and a second normal address NA2, and the control address CA may include a first control address CA1.

The first and second inverters INV3 and INV4 may receive any one of first and second normal addresses NA1 and NA2. For example, the first inverter INV3 may receive the first normal address NA1, and the second inverter INV4 may receive the second normal address NA2. Hereinafter, when a value corresponding to logic low is defined as 0, and a value corresponding to logic high is defined as 1, and a signal (for example, a word line signal) having a value of 1 is provided to a word line, it is assumed that the word line is enabled.

The first and second inverters INV3 and INV4 may reverse the first and second normal addresses NA1 and NA2 and output the reversed first and second normal addresses RNA1 and RNA2. Values of the first and second normal addresses NA1 and NA2 may be 0 and 1, respectively. Values of inverted first and second normal addresses RNA1 and RNA2 may be 1 and 0, respectively. For example, the first inverter INV3 may receive the first normal address NA1, and generate the reversed first normal address RNA1. The second inverter INV4 may receive the second normal address NA2, and generate a value of a reversed second normal address RNA2.

In a normal mode of the memory device 100, the first control address CA1 may have a certain logic value. For example, the first control address CA1 may have a value of 0 corresponding to logic low. In this case, the first through fourth OR gates 12, 22, 32, and 42 may provide outputs from the first through fourth AND gates 11, 21, 31, and 41 to corresponding word lines, respectively.

The first through fourth AND gates 11, 21, 31, and 41 may receive the first and second normal addresses NA1 and NA2 and the reversed first and second normal addresses RNA1 and RNA2, and perform an AND operation on the received first and second normal addresses NA1 and NA2 and the received reversed first and second normal addresses RNA1 and RNA2. The first through fourth AND gates 11, 21, 31, and 41 may provide a word line signal for enabling respectively corresponding word lines, when the values of the received first and second normal addresses NA1 and NA2 and the received reversed first and second normal addresses RNA1 and RNA2 are all 1.

For example, when all values of the received reversed first and second normal addresses RNA1 and RNA2 of the first AND gate 11 are 1, the first AND gate 11 may enable the corresponding first word line WL0. In contrast, when the values of the reversed first and second normal addresses RNA1 and RNA2 of the first AND gate 11 are all 0, the first AND gate 11 may disable the corresponding first word line WL0.

In an initialization mode of the memory device 100, the first control address CA1 may have a value of 1 corresponding to logic high. The first through fourth OR gates 12, 22, 32, and 42 may receive the output values of the first through fourth AND gates 11, 21, 31, and 41 and the first control address CAL Each of the first through fourth OR gates 12, 22, 32, and 42 may perform an OR operation on the received outputs of the first through fourth AND gates 11, 21, 31, and 41 and the received first control address CA1, and as the first control address CA1 has a value of 1, may enable a word line unconnectedly corresponding to the outputs of the AND gates, which correspond to the value of 1 of the first control address CA1.

For example, when an output value of the first AND gate 11 is 0 and a value of the first control address CA1 is 1, the first OR gate 12 may enable the corresponding first word line WL0. In other words, when the value of the first control address CA1 is 1, all of the outputs of the first through fourth OR gates 12, 22, 32, and 42 may have a logic high value, regardless of the output values from the first through fourth AND gates 11, 21, 31, and 41. Accordingly, when the value of the first control address CA1 is 1, all of the first through third word lines WL0 through WL3 may be enabled, regardless of the output values from the first through fourth AND gates 11, 21, 31, and 41.

According to the above example embodiment, any one word line may be enabled to write or read data in a normal operation of the memory cell array. On the other hand, as in the initialization operation for the memory cell array, a plurality of word lines are enabled based on the value of the first control address CA1, and values of memory cells connected to the plurality of word lines may be initialized to a value of 0 or 1.

Although a 2-bit normal address and a 1-bit control address are illustrated in FIG. 3, according to embodiments, a plurality of rows of the memory cell array may be selectively enabled by using a plurality of normal addresses and one or more control addresses.

Figure 5:
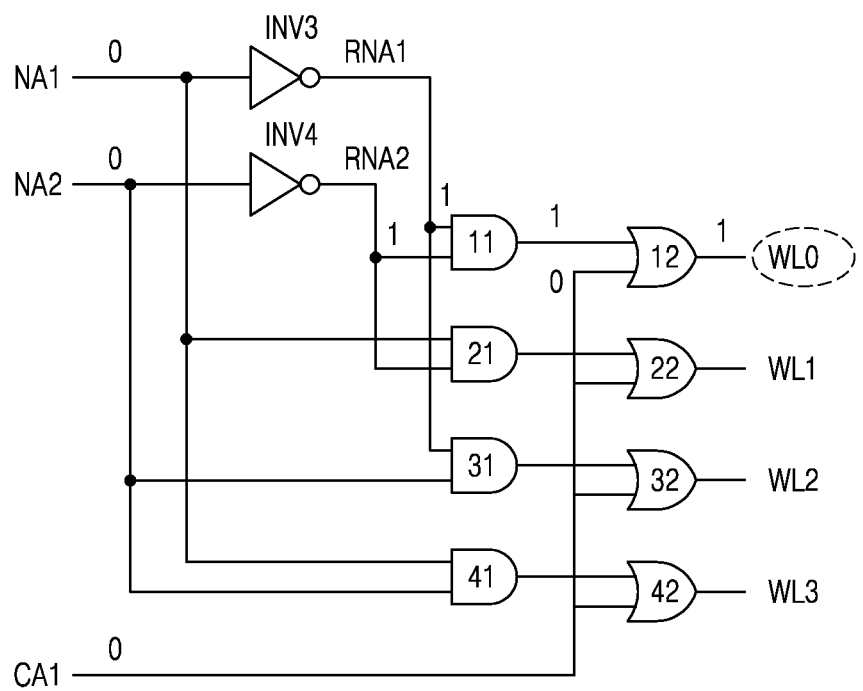
FIG. 5 is a diagram illustrating an operation in CASE 1 in FIG. 4 according to an embodiment.
Figure 6:
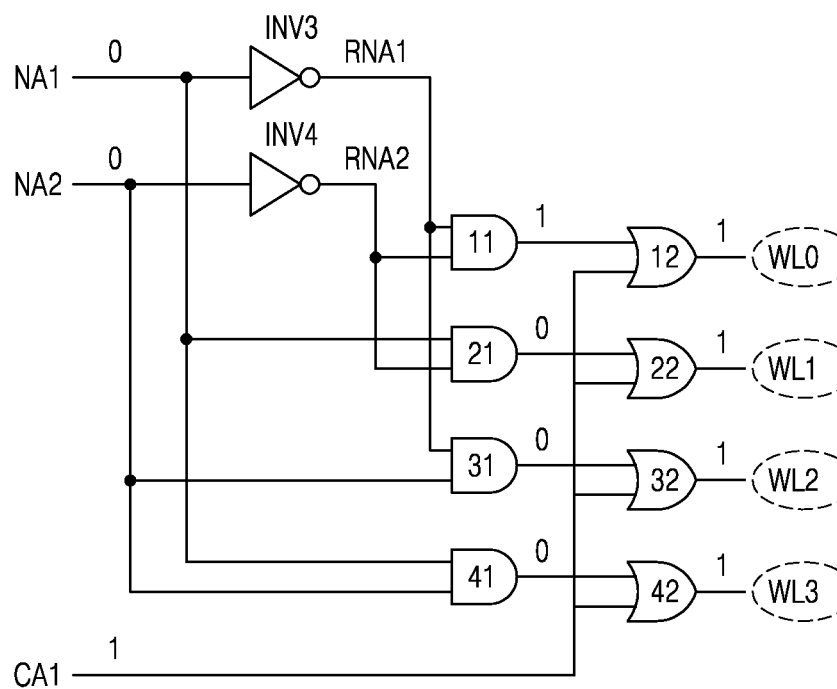
FIG. 6 is a diagram illustrating an operation in CASE 2 in FIG. 4 according to an embodiment.

FIG. 4 is a diagram illustrating a table for describing an operation in FIG. 3 according to an embodiment. FIG. 5 is a diagram illustrating an operation in CASE 1 in FIG. 4 according to an embodiment. FIG. 6 is a diagram illustrating an operation in CASE 2 in FIG. 4 according to an embodiment.

Referring to FIG. 4, at least one word line among the first through third word lines WL0 through WL3 may be enabled according to values of the first and second normal addresses NA1 and NA2 and the value of the first control address CAL For example, when the value of the first control address CA1 and the values of the first and second normal addresses NA1 and NA2 are 0, only the first word line WL0 among the first through third word lines WL0 through WL3 may be enabled.

In another example, when the value of the first control address CA1 and the value of the second normal address NA2 are 0, and the value of the first normal address NA1 is 1, only the third word line WL2 among the first through third word lines WL0 through WL3 may be enabled.

In another example, when the value of the first control address CA1 is 1, all of the first through third word lines WL0 through WL3 may be enabled, regardless of the values of the first and second normal addresses NA1 and NA2.

In other words, according to an embodiment as described above, any one word line may be enabled by using a normal memory operation performed on the memory cell array according to a value of the control address, or all word lines may be simultaneously enabled for the initialization operation on the memory cell array.

Referring to FIG. 5, when the value of the first control address CA1 and the values of the first and second normal addresses NA1 and NA2 are 0, only the first word line WL0 may be enabled.

The first and second normal addresses NA1 and NA2 may be received by the first and second inverters INV3 and INV4, respectively. The first and second inverters INV3 and INV4 may output values of the reversed first and second normal addresses RNA1 and RNA2.

The first AND gate 11 may receive the values of the inverted first and second normal addresses RNA1 and RNA2. The first AND gate 11 may receive the values of the reversed first and second normal addresses RNA1 and RNA2, that are both 1, and may output 1.

The first OR gate 12 may receive an output value of the first AND gate 11 and the value of the first control address CAL The first OR gate 12 may receive the output value of the first AND gate 11 of 1, and the value of the first control address CA1 of 0, and may output 1. When the output value of the first OR gate 12 is 1, the first word line WL0 may be enabled. FIG. 5 illustrates an embodiment, but embodiments of the inventive concept are not limited thereto.

Referring to FIG. 6, when the value of the first control address CA1 is 1, all of the first through third word lines WL0 through WL3 may be enabled, regardless of the values of the first and second normal addresses NA1 and NA2. It is assumed that the values of the first and second normal addresses NA1 and NA2 are 0 in the example described herein, and descriptions are given below based on this assumption.

The first inverter INV3 may receive the first normal address NA1, and output the reversed first normal address RNA1. The first inverter INV3 may receive the first normal address NA1 of 0, and output the reversed first normal address RNA1 of 1.

The second inverter INV4 may receive the second normal address NA2, and output the reversed second normal address RNA2. The second inverter INV4 may receive the second normal address NA2 of 0, and output the reversed second normal address RNA2 of 1.

The first AND gate 11 may receive the reversed first and second normal addresses RNA1 and RNA2. The first AND gate 11 may receive the reversed first and second normal addresses RNA1 and RNA2, that are both 1, and may output 1.

The second AND gate 21 may receive the first normal address NA1 and the reversed second normal address RNA2. The second AND gate 21 may receive the first normal address NA1 of 0 and the reversed second normal address RNA2 of 1, and may output 0.

The third AND gate 31 may receive the reversed first normal address RNA1 and the second normal address NA2. The third AND gate 31 may receive the reversed first normal address RNA1 of 1 and a second normal address NA2 of 0, and may output 0.

The fourth AND gate 41 may receive the first and second normal addresses NA1 and NA2. The fourth AND gate 41 may receive the first and second normal addresses NA1 and NA2, that are all 0, and may output 0.

In other words, only the output value of the first AND gate 11 may be 1, and the output values of the second through fourth AND gates 21, 31, and 41 may be 0.

The first through fourth OR gates 12, 22, 32, and 42 may receive the first control address CAL The first through fourth OR gates 12, 22, 32, and 42 may receive the first control address CA1 of 1. In other words, the output values of the first through fourth OR gates 12, 22, 32, and 42 may all be 1.

According to an embodiment as described above, when the output values of the first through fourth OR gates 12, 22, 32, and 42 are 1, the first through third word lines WL0 through WL3 may be simultaneously enabled, and at the same time, the data initialization operation may be performed on the memory cells connected to the first through third word lines WL0 through WL3. FIG. 6 illustrates an embodiment, but embodiments of the inventive concept are not limited thereto.

Figure 7:
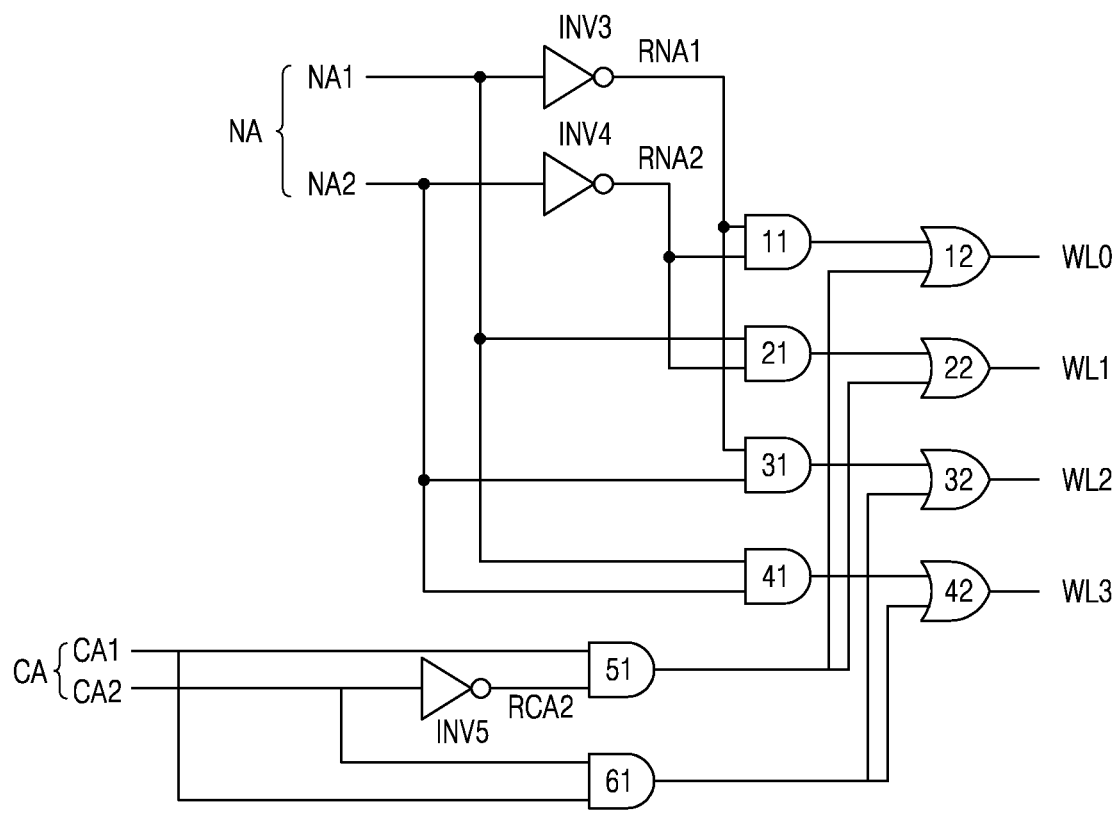
FIG. 7 is a logic diagram of a row decoder in a memory device, according to an embodiment.

FIG. 7 is a logic diagram of the XDEC 120 in a memory device, according to an embodiment. Hereinafter, for convenience of explanation, a further description of components and technical aspects previously described with reference to FIG. 3 is omitted.

Referring to FIG. 7, the XDEC 120 may include first through third inverters INV3 through INV5, first through sixth AND gates 11, 21, 31, 41, 51, 61, and the first through fourth OR gates 12, 22, 32, and 42.

The control address CA may include the first control address CA1 and the second control address CA2. The third inverter INV5 may receive the second control address CA2 and output the inverted second control address RCA1.

The fifth AND gate 51 may receive the first control address CA1 and output a reversed second control address RCA2. The fifth AND gate 51 may output a value of 1, when the value of the received first control address CA1 and the value of the reversed second control address RCA2 are both 1. The output of the fifth AND gate 51 may be provided as an input of some of the first through fourth OR gates 12, 22, 32, and 42. For example, the output of the fifth AND gate 51 may be provided as an input of the first and second OR gates 12 and 22.

The sixth AND gate 61 may receive the first and second control addresses CA1 and CA2. When the values of the received first and second control addresses CA1 and CA2 are both 1, the sixth AND gate 61 may output a value of 1. The output of the sixth AND gate 61 may be provided as an input of some of the first through fourth OR gates 12, 22, 32, and 42. For example, the output of the sixth AND gate 61 may be provided as an input of the third and fourth OR gates 32 and 42.

Figure 9:
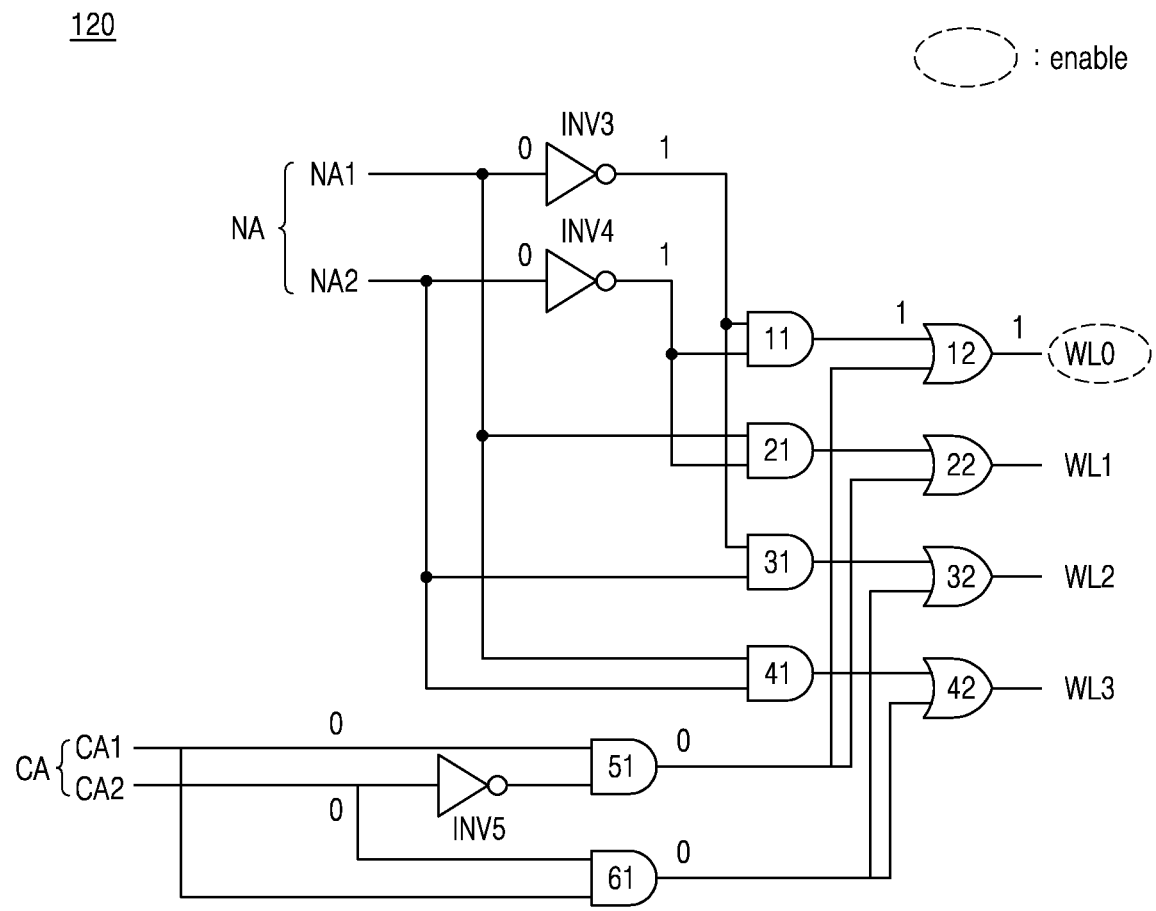
FIG. 9 is a diagram illustrating an operation in CASE 1 in FIG. 8 according to an embodiment.
Figure 10:
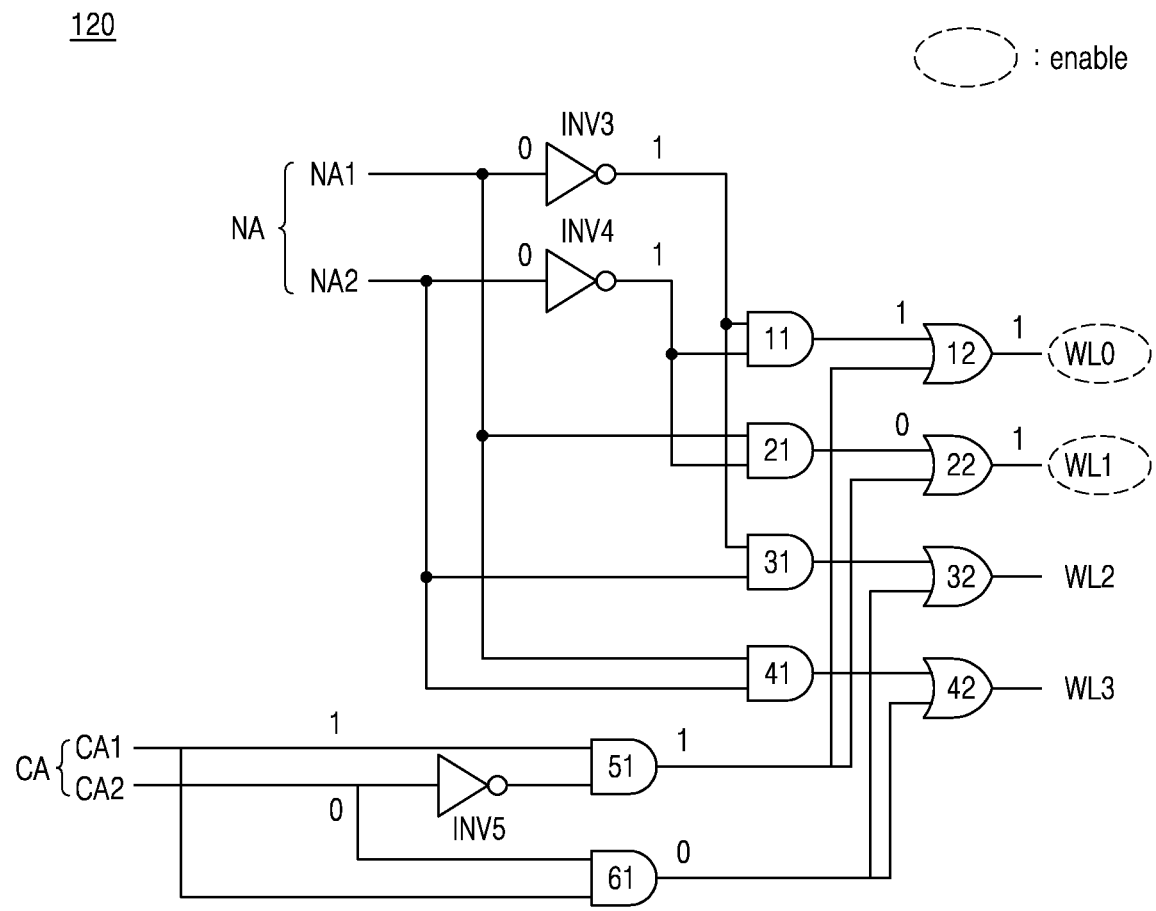
FIG. 10 is a diagram illustrating an operation in CASE 2 in FIG. 8 according to an embodiment.
Figure 11:
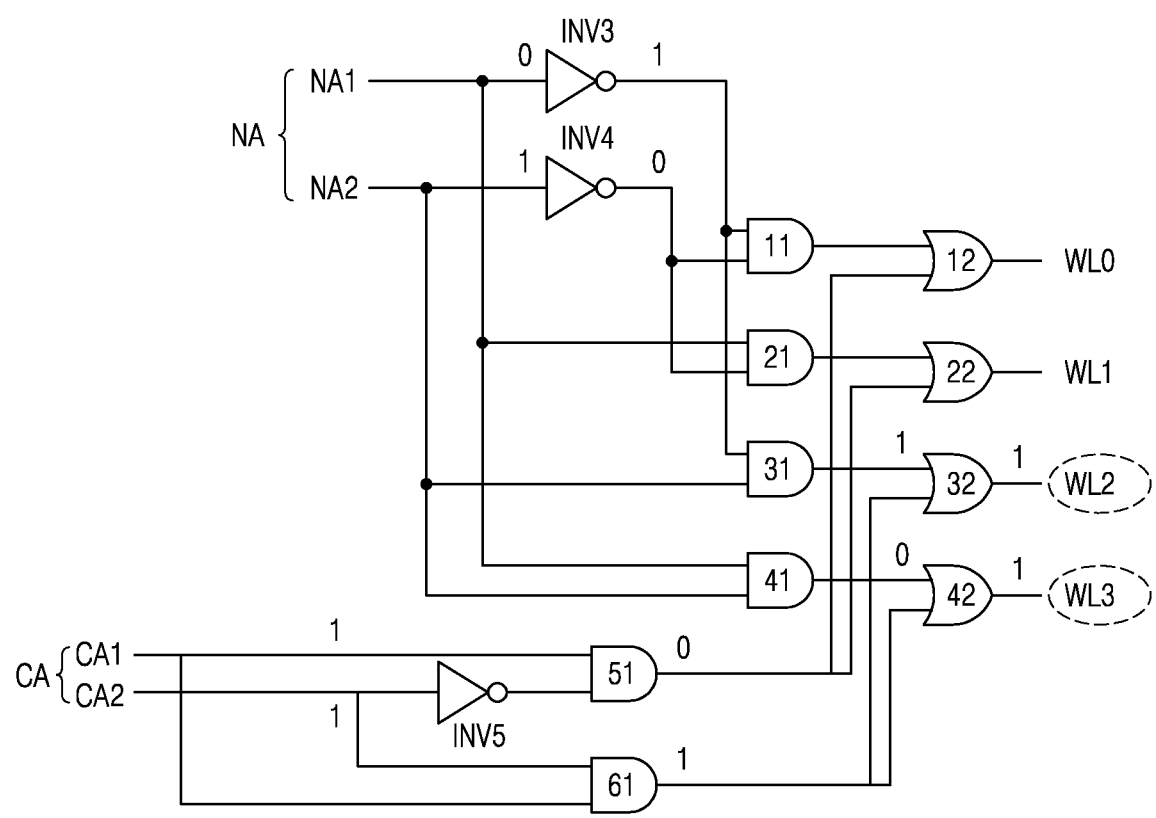
FIG. 11 is a diagram illustrating an operation in CASE 3 in FIG. 8 according to an embodiment.

FIG. 8 is a diagram illustrating a table for describing an operation of FIG. 7 according to an embodiment. FIG. 9 is a diagram illustrating an operation in CASE 1 in FIG. 8 according to an embodiment. FIG. 10 is a diagram illustrating an operation in CASE 2 in FIG. 8 according to an embodiment. FIG. 11 is a diagram illustrating an operation in CASE 3 in FIG. 8 according to an embodiment. Hereinafter, duplicate descriptions previously given with reference to FIGS. 4 through 6 are omitted.

Referring to FIG. 8, one or more word lines among the first through third word lines WL0 through WL3 may be enabled according to the values of the first and second normal addresses NA1 and NA2 and the values of the first and second control addresses CA1 and CA2.

For example, in the normal mode of the memory device, the first control address CA1 may have a value of 0 corresponding to logic low, and any one word line among the first through third word lines WL0 through WL3 may be enabled regardless of the value of the second control address CA2. For example, when the values of the first normal address NA1, the second normal address NA2, and the first control address CA1 are all 0, only the first word line WL0 among the first through third word lines WL0 through WL3 may be enabled.

On the other hand, in the initialization mode of the memory device, the first control address CA1 may have a value of 1, and some word lines among the first through third word lines WL0 through WL3 may be selectively enabled according to the values of the first control address CA1 and the second control address CA2. In addition, when some word lines are selected, at least one normal address may be further used. In the example of FIG. 8, the case in which the second normal address NA2 is further used is shown. For example, when the value of the second control address CA2 is 0 and the value of the second normal address NA2 is 0, only the first and second word lines WL0 and WL1 among the first through third word lines WL0 through WL3 may be enabled.

On the other hand, when the first and second control addresses CA1 and CA2 have values of 1, and the second normal address NA2 has a value of 1, only the third and fourth word lines WL2 and WL3 among the first through third word lines WL0 through WL3 may be enabled.

According to an embodiment as described above, when the value of the first control address CA1 is 0, the normal memory operation may be performed regardless of the value of the second control address CA2. Accordingly, any one word line may be enabled based on the values of the first normal address NA1 and the second normal address NA2. On the other hand, in the initialization operation performed on the memory cell array, when the value of the first control address CA1 has a value of 1, a plurality of word lines may be simultaneously enabled. In an embodiment as described above, word lines in a certain region of the memory cell array may be selectively enabled. For example, word lines at different positions may be enabled according to the value of the second control address CA2, and then, data may be initialized.

Referring to FIG. 9, the case in which the values of the first control address CA1 and the first and second normal addresses NA2 are 0 in the normal mode of the memory device is illustrated, and only the first word line WL0 among the first through third word lines WL0 through WL3 may be enabled. When the value of the first control address CA1 is 0, the outputs of the fifth AND gate 51 and the sixth AND gate 61 may correspond to 0 regardless of the value of the second control address CA2. Hereinafter, it is assumed that the value of the second control address CA2 is 0, and descriptions are given below based on this assumption.

The fifth AND gate 51 may receive the first control address CA1 and the reversed second control address RCA2. The fifth AND gate 51 may receive the first control address CA1 of 0 and the reversed second control address RCA2 of 1, and may output 0.

The first OR gate 12 may receive the output value of the first AND gate 11 and the output value of the fifth AND gate 51. The first OR gate 12 may output 1 corresponding to logic high, when the output value of the first AND gate 11 or the output value of the fifth AND gate 51 is 1. The first OR gate 12 may receive the output value of the first AND gate 11 of 1 and the output value of the fifth AND gate 51 of 0, and may output 1.

When the output value of the first OR gate 12 is 1, only the first word line WL0 among the first through third word lines WL0 through WL3 may be enabled. FIG. 9 illustrates an embodiment, but embodiments of the inventive concept are not limited thereto.

Referring to FIG. 10, regardless of the value of the first normal address NA1, when the value of the first control address CA1 is 1, the value of the second control address CA2 is 0, and the value of the second normal address NA2 is 0, only the first and second word lines WL0 and WL1 among the first through third word lines WL0 through WL3 may be enabled. Hereinafter, it is assumed that the value of the first normal address NA1 is 0, and descriptions are given below based on this assumption.

The first AND gate 11 may receive the reversed first and second normal addresses RNA1 and RNA2. The first AND gate 11 may receive the reversed first and second normal addresses RNA1 and RNA2, that are both 1, and may output 1.

The second AND gate 21 may receive the first normal address NA1 and the reversed second normal address RNA2. The second AND gate 21 may receive the values of the first normal address NA1 of 0 and the reversed second normal address RNA2 of 1, and may output 0.

The fifth AND gate 51 may receive the first control address CA1 of 1 and the reversed second control address RCA2 of 1, and may output 1.

The first OR gate 12 may receive the output value of the first AND gate 11 of 1 and the output value of the fifth AND gate 51 of 1, and may output 1. When the output value of the first OR gate 12 is 1, the first word line WL0 among the first through third word lines WL0 through WL3 may be enabled.

The second OR gate 22 may receive an output value of the second AND gate 21 and the output value of the fifth AND gate 51. The second OR gate 12 may receive the output value of the second AND gate 21 of 1 and the output value of the fifth AND gate 51 output of 1, and may output 1. When the output value of the second OR gate 22 is 1, the second word line WL1 among the first through third word lines WL0 through WL3 may be enabled.

On the other hand, when the value of the second normal address NA2 is 0, outputs of the third AND gate 31 and the fourth AND gate 41 may have a value of 0, regardless of the value of the first normal address NA1, and when the output of the sixth AND gate 61 has a value of 0, each of the outputs of the third and fourth OR gates 32 and 42 may have a value of 0.

In other words, when the value of the first control address CA1 is 1, the value of the second control address CA2 is 0, and the second normal address NA2 value is 0, only the first and second word lines WL0 and WL1 among the first through third word lines WL0 through WL3 may be enabled. FIG. 10 illustrates an embodiment, but embodiments of the inventive concept are not limited thereto.

Referring to FIG. 11, regardless of the value of the first normal address NA1, when the values of the first and second control addresses CA1 and CA2 and the value of the second normal address NA2 are 1, only the second and third word lines WL1 and WL2 among the first through third word lines WL0 through WL3 may be enabled. Hereinafter, it is assumed that the value of the first normal address NA1 is 0, and descriptions are given based on this assumption.

The third AND gate 31 may receive the reversed first normal address RNA1 and the second normal address NA2. The third AND gate 31 may receive the reversed first normal address RNA1 of 1 and a second normal address NA2 of 1, and may output 1.

The fourth AND gate 41 may receive the first and second normal addresses NA1 and NA2. The fourth AND gate 41 may receive the first normal address NA1 of 0 and the second normal address NA2 of 1, and may output 0. The sixth AND gate 61 may receive the first and second control addresses CA1 and CA2. The sixth AND gate 61 may receive the first and second control addresses CA1 and CA2, which are both 1, and may output 1.

The third OR gate 32 may receive an output value of the third AND gate 31 and an output value of the sixth AND gate 61. The third OR gate 32 may receive the output values of the third AND gate 31 of 1 and the sixth AND gate 61 of 1, and may output 1. When the output value of the third OR gate 32 is 1, the third word line WL2 among the first through third word lines WL0 through WL3 may be enabled.

The fourth OR gate 42 may receive an output value of the fourth AND gate 41 and the output value of the sixth AND gate 61. The fourth OR gate 42 may receive the output value of the fourth AND gate 41 of 0 and the output value of the sixth AND gate 61 of 1, and may output 1. When the output value of the fourth OR gate 42 is 1, the fourth word line WL3 among the first through third word lines WL0 through WL3 may be enabled.

On the other hand, when the value of the second normal address NA2 is 1, the outputs of the first AND gate 11 and the second AND gate 21 may have a value of 0, regardless of the value of the first normal address NA1, and when the output of the fifth AND gate 51 has a value of 0, each of the outputs of the first and second OR gates 12 and 22 may have a value of 0.

In other words, when the values of the first and second control addresses CA1 and CA2 and the value of the second normal address NA2 are 1, only the third and fourth word lines WL2 and WL3 among the first through third word lines WL0 through WL3 may be enabled. FIG. 11 illustrates an embodiment, but embodiments of the inventive concept are not limited thereto.

Figure 12:
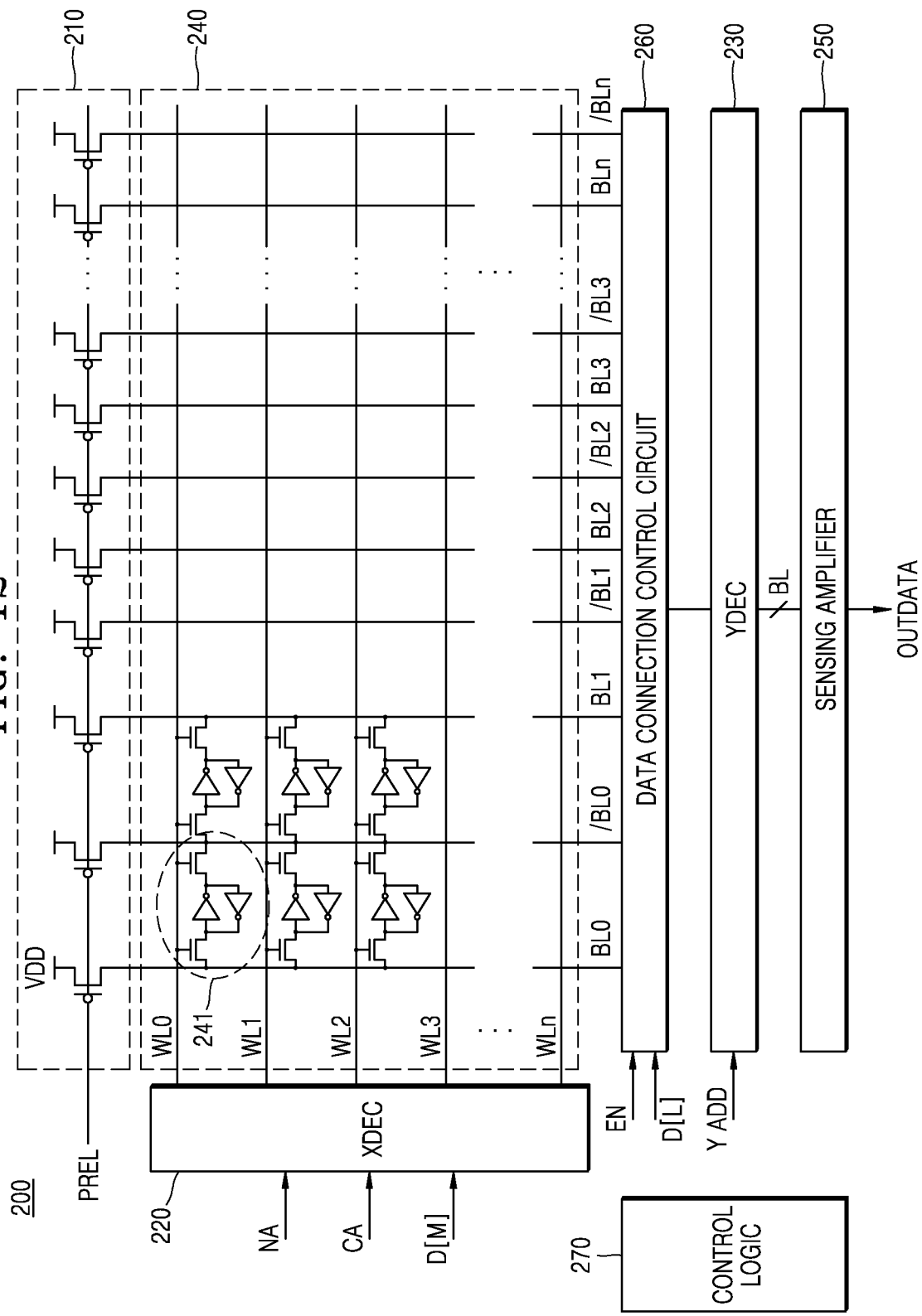
FIG. 12 is a block diagram of a memory device according to an embodiment.

FIG. 12 is a block diagram of a memory device 200 according to an embodiment. Hereinafter, for convenience of explanation, a further description of components and technical aspects previously described with reference to FIG. 1 is omitted.

The memory device 200 may include a precharge circuit 210, an XDEC 220, a YDEC 230, a memory cell array 240, a sense amplifier 250, a data connection control circuit 260, and a control logic 270.

The data connection control circuit 260 may be connected to the memory cell array 240 via the first through nth bit lines BL0 through BLn and /BL0 through /BLn. The data connection control circuit 260 may receive an enable signal EN from the control logic 270 of the memory device 200. The control logic 270 may activate and output the enable signal EN in the initialization mode of the memory device 200. In addition, the data connection control circuit 260 may control a connection between data and the first through nth bit lines BL0 through BLn and/BL0 through /BLn in response to the enable signal EN.

Figure 13:
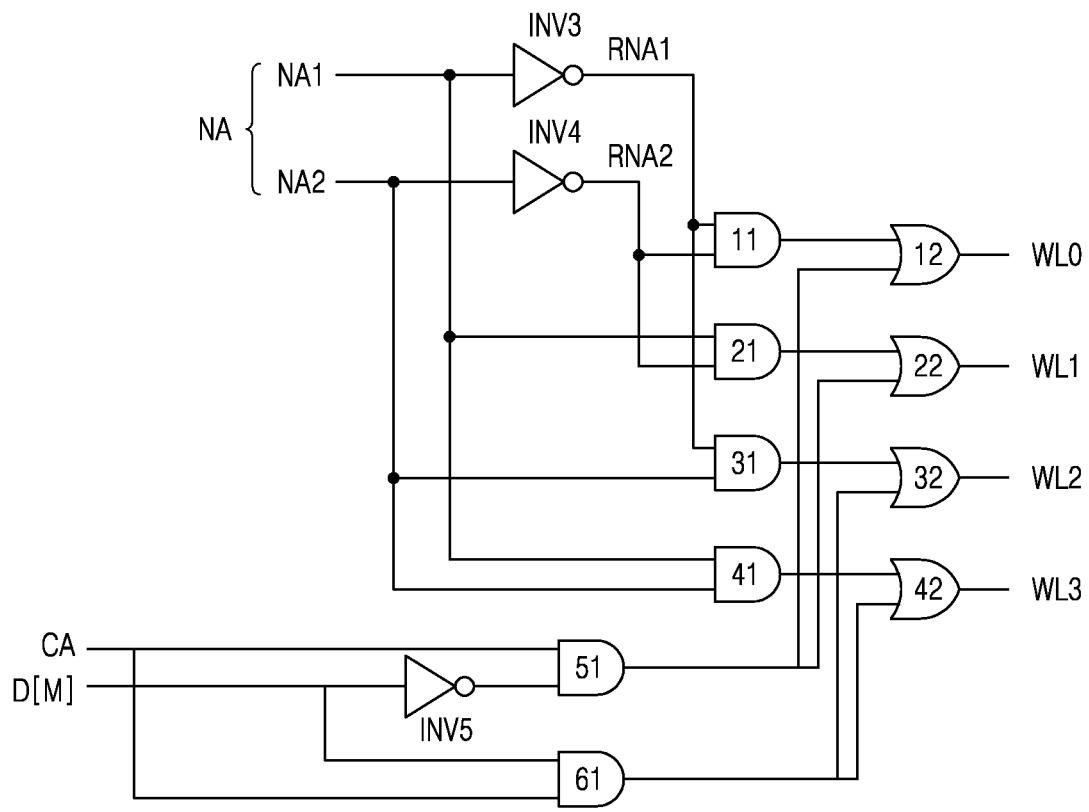
FIG. 13 is a logic diagram of a row decoder and a data connection control circuit in a memory device, according to an embodiment.

FIG. 13 is a logic diagram of the XDEC 220 and the data connection control circuit 260 in the memory device 200, according to an embodiment. Hereinafter, for convenience of explanation, a further description of components and technical aspects previously described with reference to FIG. 7 is omitted.

Referring to FIG. 13, the XDEC 220 may receive the first and second normal addresses NA1 and NA2, the control address CA, and at least one bit of data. The data may include N bits (where N is a natural number of two or more), and an example in which the most significant bit (MSB) D[M] of data is provided to the row decoder 120 is illustrated.

The MSB D[M] of data may have a value of 0 or 1. The MSB D[M] may be provided to the fifth AND gate 51 and the sixth AND gate 61. The least significant bit (LSB) D[L] of data may be provided to the data connection control circuit 260, and the data connection control circuit 260 may connect a path for transmitting the LSB D[L] to the first through nth bit lines BL0 through BLn in response to the enable signal EN. For example, when the enable signal EN is activated, the data connection control circuit 260 may control a switching operation by using control internal switches so that the LSB D[L] is provided together to the first through $n^{th}$ bit lines BL0 through BLn.

The LSB D[L] may have a value of 0 or 1. The memory device 200 may initialize memory cells 241 of the memory cell array 240 with a value corresponding to the LSB D[L]. For example, when the value of the LSB D[L] is 0, the memory cells 241 of the memory cell array 240 may be initialized to 0, and when the value of the LSB D[L] is 1, the memory cells 241 of the memory cell array 240 may be initialized to 1.

The embodiment described above is an example, and embodiments of the inventive concept are not limited thereto. For example, according to embodiments, any one or more bits among a plurality of bits of data may be provided to the XDEC 220 to be used for an enabling operation of the word lines, or to be used also as values of data for initializing the other one or more bits.

Figure 15:
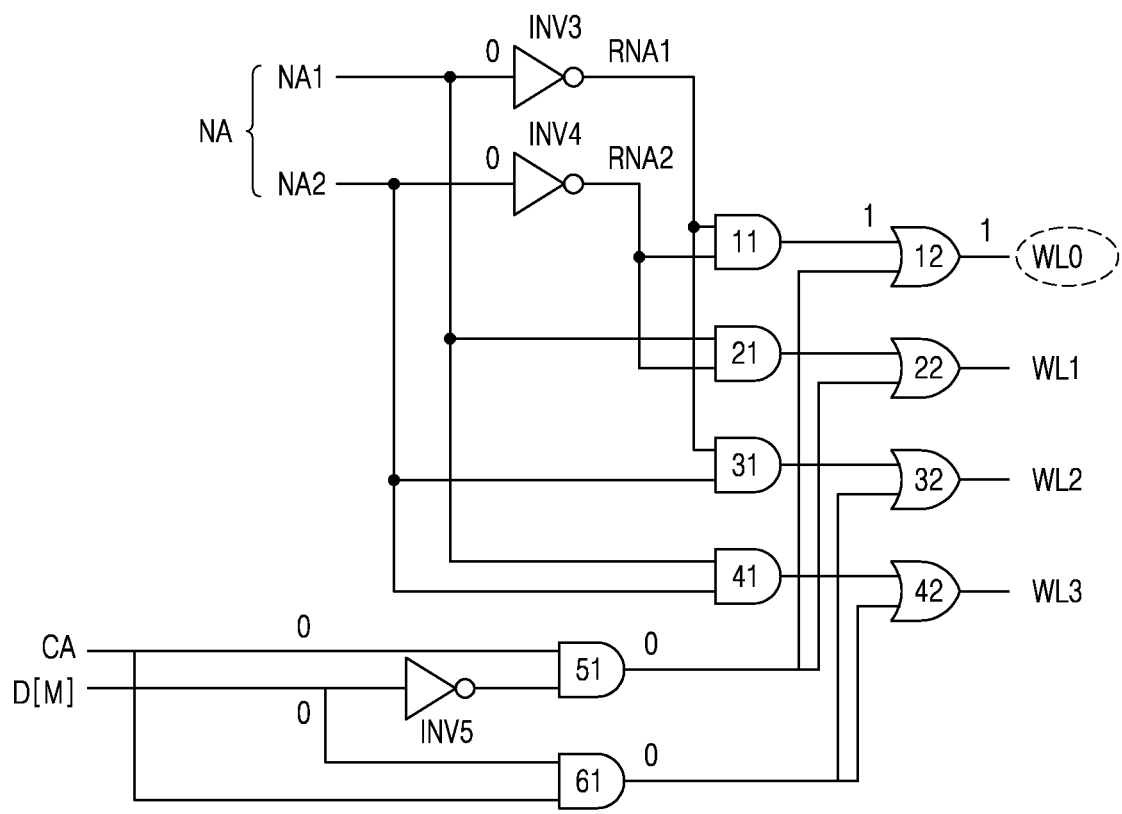
FIG. 15 is a diagram illustrating an operation in CASE 1 in FIG. 14 according to an embodiment.
Figure 16:
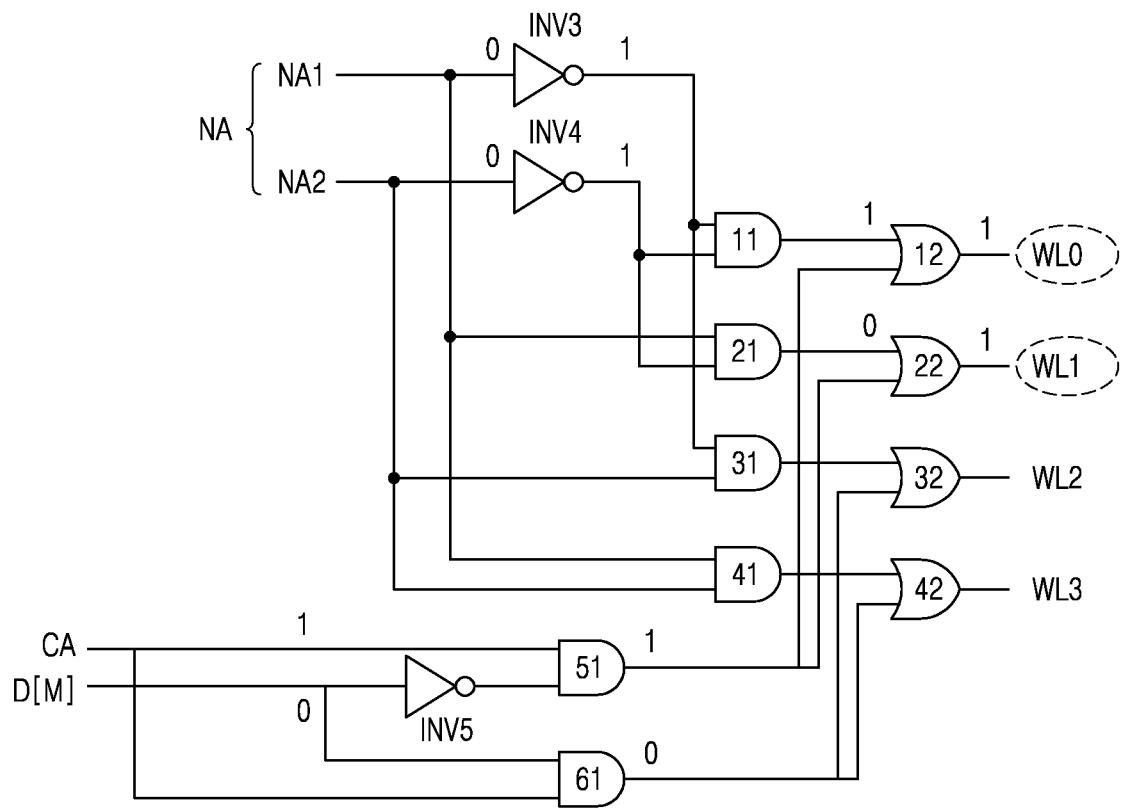
FIG. 16 is a diagram illustrating an operation in CASE 2 in FIG. 14 according to an embodiment.
Figure 17:
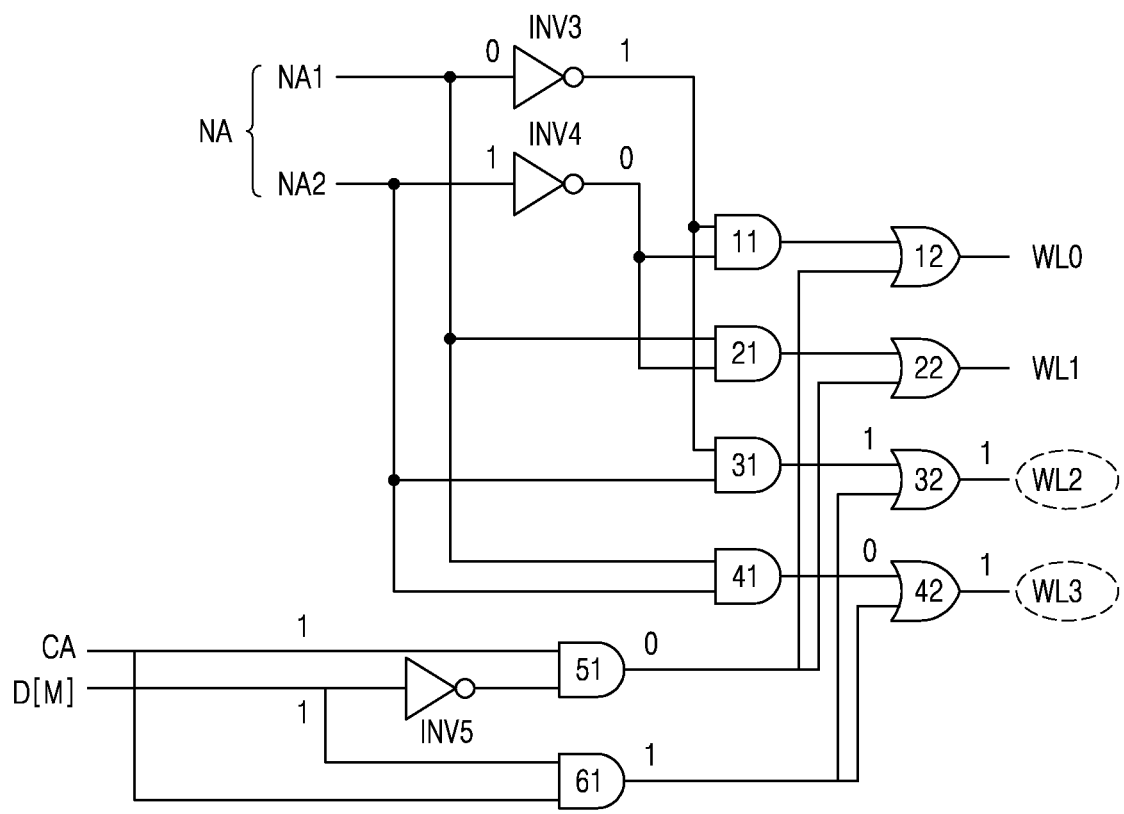
FIG. 17 is a diagram illustrating an operation in CASE 3 in FIG. 14 according to an embodiment.

FIG. 14 is a diagram illustrating a table for describing an operation of FIG. 13 according to an embodiment. FIG. 15 is a diagram illustrating an operation in CASE 1 in FIG. 14 according to an embodiment. FIG. 16 is a diagram illustrating an operation in CASE 2 in FIG. 14 according to an embodiment. FIG. 17 is a diagram illustrating an operation in CASE 3 in FIG. 14 according to an embodiment. Hereinafter, for convenience of explanation, a further description of components and technical aspects previously described with reference to FIGS. 8 through 11 is omitted.

Referring to FIG. 14, at least one word line among the first through nth word lines WL0 through WLn may be enabled, according to values of the first and second normal addresses NA1 and NA2, the value of the control address CA, and the MSB D[M] of data.

For example, in the normal mode of the memory device, the control address CA may have a value of 0 corresponding to logic low, and any one word line may be enabled according to the first normal address NA1 and the second normal address NA2. For example, when all of the values of both the first normal address NA1 and the second normal address NA2 are 0, only the first word line WL0 among the first through third word lines WL0 through WL3 may be enabled.

On the other hand, in the initialization mode of the memory device, the control address CA may have a value of 1. In addition, regardless of the value of the first normal address NA1, a plurality of word lines at particular locations may be simultaneously enabled according to the value of the MSB D[M] of data and the value of the second normal address NA2. For example, when the value of the second normal address NA2 is 0 and the value of the MSB D[M] of data is 0, only the first and second word lines WL0 and WL1 among the first through third word lines WL0 through WL3 may be enabled.

On the other hand, when all of the value of the control address CA, the value of the MSB D[M] of data, and the value of the second normal address NA2 are 1, only the third and fourth word lines WL2 and WL3 among the first through third word lines WL0 through WL3 may be enabled.

In addition, in the initialization mode of the memory device, an initialization value of memory cells of a plurality of enabled word lines may correspond to a value of the LSB D[L] of data. For example, when the LSB D[L] of data has a value of 1 while the third and fourth word lines WL2 and WL3 are enabled, the memory cell connected to the third and fourth word lines WL2 and WL3 may be initialized to a value of 1.

On the other hand, referring to FIG. 15, in the normal mode of the memory device, the control address CA may have a value of 0, and when the value of the control address CA is 0, the outputs of the fifth AND gate 51 and the sixth AND gate 61 may correspond to 0. In addition, in the normal mode of the memory device, any one word line may be enabled according to values of the first and second normal addresses NA1 and NA2, and when the values of the first and second normal addresses NA1 and NA2 are 0, the first word line WL0 may be enabled.

In the normal mode of the memory device, the enable signal EN according to an embodiment as described above may be deactivated, and each bit line may receive a corresponding data bit based on the control of the data connection control circuit 260. For example, N-bit data may be provided in response to N bit lines, and each memory cell may write data according to a data bit provided via a corresponding bit line, or output the stored data via a corresponding bit line.

The memory device 200 may enter the initialization mode under the control of a control logic 270, and in this case, an operation of enabling a plurality of word lines according to an embodiment as described above may be performed. In addition, the control logic 270 may activate and output the enable signal EN in the initialization mode, and the enable signal EN may be provided to the data connection control circuit 260. The data connection control circuit 260 may control a data transfer path between data and the first through nth bit lines BL0 through BLn and /BL0 through/ BLn in response to the enable signal EN. For example, in the initialization mode of the memory device 200, the LSB D[L] of data may be provided to the data connection control circuit 260, and when the enable signal EN is activated, the data connection control circuit 260 may provide the LSB D[L] of data to the first through $n^{th}$ bit lines BL0 through BLn and/BL0 through/BLn.

Referring to FIG. 16, in a test mode, the control address CA may have a value of 1, and regardless of the first normal address NA1 value, when the value of the MSB D[M] of data and the second normal address NA2 are 0, only first and second word lines WL0 and WL1 among the first through third word lines WL0 through WL3 may be enabled. Hereinafter, it is assumed that the value of the first normal address NA1 is 0, and descriptions are given based on this assumption.

The fifth AND gate 51 may receive the control address CA having a value of 1 and a reversed MSB D[M] having a value of 1, and may output 1. Each of the first OR gate 12 and the second OR gate 22 may output a value of 1 after receiving an output of the fifth AND gate 51 having a value of 1, and accordingly, the first word line WL0 and the second word line WL1 among the first through third word lines WL0 through WL3 may be enabled. On the other hand, each of the third OR gate 32 and the fourth OR gate 42 may receive an input corresponding to 0, and accordingly, in an embodiment, the third and fourth word lines WL2 and WL3 are not enabled.

On the other hand, the data connection control circuit 260 may include a plurality of switches for controlling an electrical connection relationship between the LSB D[L] and the first through nth bit lines BL through BLn and/BL0 through/BLn, and when the enable signal EN is activated, the LSB D[L] may be provided to the first through nth bit lines BL through BLn and /BL0 through/BLn. Accordingly, when the LSB D[L] is provided to the memory cells connected to the enabled word lines among the first through third word lines WL0 through WL3, the memory cells may be initialized to a value corresponding to the LSB D[L]. For example, when the value of the LSB D[L] is 0, the memory cells connected to the enabled word lines may be initialized to 0. On the other hand, when the value of the LSB D[L] is 1, the memory cells connected to the enabled word lines may be initialized to 1.FIG. 16 illustrates an embodiment, but embodiments of the inventive concept are not limited thereto.

Referring to FIG. 17, when in the test mode, all of the value of the control address CA, the value of the MSB D[M] of data, and the value of the second normal address NA2 are 1, and only the third and fourth word lines WL2 and WL3 among the first through third word lines WL0 through WL3 may be enabled. Hereinafter, it is assumed that the value of the first normal address NA1 is 0, and descriptions are given based on this assumption.

The sixth AND gate 61 may receive the control address CA and the MSB D[M]. The sixth AND gate 61 may receive the values of the control address CA and the MSB D[M], which are both 0, and may output 1.

Each of the third and fourth OR gates 32 and 42 may output a value of 1 after receiving an output of the sixth AND gate 61 having a value of 1, and accordingly, the third word line WL2 and the fourth word line WL3 among the first through third word lines WL0 through WL3 may be enabled. On the other hand, each of the first OR gate 12 and the second OR gate 22 receives an input corresponding to 0, and accordingly, in an embodiment, the first and second word lines WL0 and WL1 are not. In addition, the bit lines corresponding to the memory cells connected to the enabled third word line WL2 and the fourth word line WL3 may be provided with the LSB D[L] of data, and may be initialized to a value corresponding to the LSB D[L]. FIG. 17 shows an embodiment of the inventive concept, but embodiments of the inventive concept are not limited thereto.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the inventive concept has been particularly shown and described with reference to embodiments thereof, it will be understood that various changes in form and detail may be made therein without departing from the spirit and scope of the inventive concept as defined by the following claims.

What is claimed is:

1. A memory device, comprising:
a row decoder that receives one or more normal addresses and one or more control addresses; and
a memory cell array connected to the row decoder via a plurality of word lines,
wherein the memory cell array comprises a plurality of memory cells,
wherein, in a normal operation, in response to receiving the one or more normal addresses, any one word line among the plurality of word lines is enabled,
wherein, in an initialization operation, in response to receiving the one or more normal addresses and the one or more control addresses, at least two word lines among the plurality of word lines are enabled,
wherein the at least two word lines are selected based on a combination of bit values of the one or more normal addresses and bit values of the one or more control addresses,
wherein data of memory cells from among the plurality of memory cells connected to the enabled at least two word lines is initialized.

2. The memory device of claim 1,
wherein each of the memory cells comprises:
a first transistor, a second transistor, a first inverter, and a second inverter,
wherein one terminal of each of the first transistor and the second transistor is connected to a corresponding word line among the plurality of word lines,
wherein another terminal of each of the first transistor and the second transistor is connected to a bit line.

3. The memory device of claim 1,
wherein the one or more control addresses comprise a first control address, and
a value of the first control address is 0 or 1.

4. The memory device of claim 3,
wherein, in the normal operation, the first control address has a value of 0,
wherein one word line among the plurality of word lines is enabled according to the one or more normal addresses, and data is written in a memory cell among the plurality of memory of memory cells connected to the enabled one word line.

5. The memory device of claim 3,
wherein, in the initialization operation, the first control address has a value of 1,
wherein two or more word lines among the plurality of word lines are enabled, and memory cells among the plurality of memory cells connected to the enabled two or more word lines are initialized.

6. The memory device of claim 5,
wherein the one or more normal addresses comprise a first normal address, the one or more control addresses further comprise a second control address, and the second control address comprises a value of 0 or 1,
wherein, in the initialization operation, some word lines among the plurality of word lines are simultaneously enabled according to the first normal address, the first control address, and the second control address.

7. The memory device of claim 6,
wherein, in the initialization operation, when a value of the first normal address is 0, and the value of the second control address is 0,
word lines of a first group comprising some word lines among the plurality of word lines are simultaneously enabled.

8. The memory device of claim 7,
wherein, in the initialization operation, when the value of the first normal address is 1, and the value of the second control address is 1,
word lines of a second group comprising some other word lines among the plurality of word lines are simultaneously enabled.

9. A data initialization method of a memory device, the method comprising:
receiving one or more normal addresses and one or more control addresses; and
selecting and enabling one or more word lines among a plurality of word lines in response to receiving the one or more normal addresses and the one or more control addresses,
wherein the selecting and enabling of the one or more word lines causes the memory device to operate in a normal operation or an initialization operation,
wherein, in the normal operation, in response to receiving the one or more normal addresses, any one word line among the plurality of word lines is enabled;
wherein, in the initialization operation, in response to receiving the one or more normal addresses and the one or more control addresses, at least two word lines among the plurality of word lines are enabled,
wherein the at least two word lines are selected based on a combination of bit values of the one or more normal addresses and bit values of the one or more control addresses,
wherein data of memory cells connected to the enabled at least two word lines is initialized.

10. The method of claim 9,
wherein each of memory cells connected to the plurality of word lines comprises:
a first transistor, a second transistor, a first inverter, and a second inverter,
wherein one terminal of each of the first transistor and the second transistor is connected to a corresponding word line from among the plurality of word lines,
wherein another terminal of each of the first transistor and the second transistor is connected to the bit line.

11. The method of claim 9,
wherein the one or more control addresses comprise a first control address, and
a value of the first control address has a value of 0 or 1.

12. The method of claim 11,
wherein, in the normal operation, the first control address has a value of 0,
wherein one word line among the plurality of word lines is enabled according to the one or more normal addresses, and data is written in the memory cell connected to the enabled one word line.

13. The method of claim 11,
wherein, in the initialization operation, the first control address has a value of 1,
wherein two or more word lines among the plurality of word lines are enabled, and the memory cells connected to the enabled two or more word lines are initialized.

14. The method of claim 13,
wherein the one or more normal addresses comprise a first normal address, the one or more control addresses further comprise a second control address that comprises a value of 0 or 1,
wherein, in the initialization operation, some word lines among the plurality of word lines are simultaneously enabled according to the first normal address, the first control address, and the second control address.

15. The method of claim 11,
wherein, in the initialization operation, when a value of a first normal address among the one or more normal addresses is 0, and a value of a second control address among the one or more control addresses is 0,
word lines of a first group comprising some word lines among the plurality of word lines are simultaneously enabled.

16. The method of claim 11,
wherein, in the initialization operation, when a value of a first normal address among the one or more normal addresses is 1, and the value of a second control address among the one or more control addresses is 1,
word lines of a second group comprising some other word lines among the plurality of word lines are simultaneously enabled.

17. A memory device, comprising:
a row decoder that receives one or more normal addresses and one or more control addresses;
a column decoder that receives data of two bits or more;
a memory cell array comprising a plurality of memory cells, connected to the row decoder via a plurality of word lines, and connected to the column decoder via a plurality of bit lines;
a data connection control circuit connected to the memory cell array via the plurality of bit lines and configured to control a value of data provided to the plurality of bit lines; and
a control logic configured to generate an enable signal activated in an initialization operation, and transmit the generated enable signal to the data connection control circuit,
wherein, in a normal operation, in response to receiving the one or more normal addresses, any one word line among the plurality of word lines is enabled, and
wherein, in the initialization operation, in response to receiving the one or more normal addresses, the one or more control addresses, and a data most significant bit (MSB), at least two word lines among the plurality of word lines are enabled, and data of memory cells of the memory cell array connected to the enabled at least two word lines are initialized,
wherein the at least two word lines are selected based on a combination of bit values of the one or more normal addresses and bit values of the one or more control addresses.

18. The memory device of claim 17,
wherein the row decoder
receives a first normal address, a second normal address, a control address, and the data MSB, and
values of the first normal address, the second normal address, the control address, and the data MSB are 0 or 1, and
wherein the column decoder
receives a data least significant bit (LSB), a value of the data LSB is 0 or 1, and
data of a memory cell among the plurality of memory cells is initialized according to the value of the data LSB, in response to the enable signal.

19. The memory device of claim 18, wherein, when a value of a first control address among the one or more control addresses is 0,
only one or more word lines among the plurality of word lines are enabled, and a data value of the memory cell is initialized according to a value of the data LSB.

20. The memory device of claim 18,
wherein, when a value of a first control address among the one or more control addresses is 1,
two or more word lines among the plurality of word lines are enabled, and a data value of the memory cell is initialized according to the value of the data LSB.

* * * * *